(12) United States Patent
Yu

(10) Patent No.: US 6,750,698 B1
(45) Date of Patent: Jun. 15, 2004

(54) CASCADE CIRCUITS UTILIZING NORMALLY-OFF JUNCTION FIELD EFFECT TRANSISTORS FOR LOW ON-RESISTANCE AND LOW VOLTAGE APPLICATIONS

(75) Inventor: Ho-Yuan Yu, Saratoga, CA (US)

(73) Assignee: Lovoltech, Inc., Santa Clara, CA (US)

( * ) Notice: Subject to any disclaimer, the term of this patent is extended or adjusted under 35 U.S.C. 154(b) by 94 days.

(21) Appl. No.: 09/676,370

(22) Filed: Sep. 29, 2000

(51) Int. Cl.[7] ............................................. H03K 17/687
(52) U.S. Cl. ..................... 327/430; 327/560; 330/277
(58) Field of Search ................................. 327/430, 431, 327/560, 575; 330/277, 310

(56) References Cited

U.S. PATENT DOCUMENTS

| | | | | |
|---|---|---|---|---|
| 4,712,022 A | * | 12/1987 | Vu ............................... | 326/115 |
| 4,877,976 A | * | 10/1989 | Lach et al. .................. | 326/117 |
| 4,937,474 A | * | 6/1990 | Sitch ........................... | 326/117 |
| 5,396,527 A | * | 3/1995 | Schlecht et al. ............. | 327/530 |
| 5,479,052 A | * | 12/1995 | Yuuki ........................... | 257/45 |
| 6,251,716 B1 | * | 6/2001 | Yu ............................... | 438/186 |

* cited by examiner

Primary Examiner—Timothy P. Callahan
Assistant Examiner—Terry L. Englund
(74) Attorney, Agent, or Firm—Wagner Murabito & Hao LLP

(57) ABSTRACT

The present invention relates generally to electrical cascade circuits using normally-off junction field effect transistors (JFETs) which have low on-resistance for low voltage and high current density applications. Proper configuration of the normally-off JFETs allows for low voltage drop, low-on resistance, high current density and high frequency operations. More particularly, these cascade circuits are configured to provide amplification of an input signal and signal switching capabilities. In general two or more normally-off JFETs are coupled together on a substrate to create a desired characteristic. For a three terminal gate-controlled cascade amplification circuit, an input signal at the first JFET can realize a signal gain of 80 dB to 120 dB at the second JFET. A four terminal gate-controlled cascade switching circuit, comprised of two JFETs, switches on or off to regulate current flow through the second JFET.

18 Claims, 8 Drawing Sheets

CASCADE CIRCUITS UTILIZING NORMALLY-OFF JUNCTION FIELD EFFECT TRANSISTORS FOR LOW ON-RESISTANCE AND LOW VOLTAGE APPLICATIONS

BACKGROUND OF THE INVENTION

1. Field of the Invention

The present invention relates generally to electrical circuits having cascade features utilizing normally-off junction field effect transistors having low on-resistance for low voltage and high current density applications. More particularly, these electrical circuits are configured to provide amplification of an input signal and signal switching capabilities.

2. Description of the Prior Art

Increasing attention within the semiconductor industry focuses on providing low voltage and low power circuitry capable of handling high current densities for use in a wide range of power sensitive applications such as cellular and cordless telephones, laptop personal computers, and personal digital assistants.

More specifically, circuits having cascade features, whereby two similarly configured circuit elements are coupled together, have been designed using the conventionally designed junction field effect transistor (JFET). However, the conventional JFET has seen,limited use primarily because of its normally-on state when the gate bias is zero and also because of its typically high on-resistance. Additionally, conventional JFET applications are unsuitable for operating at the lower voltages, higher current densities, and lower on state voltage drops necessitated by power sensitive applications.

In general, the junction field effect transistor is desirable in electrical circuits because it can be operated at very high frequencies and high switching speeds since it uses majority carriers. Prior Art FIGS. 1A, 1B, 1C, and 1D show conventional configuration and operational characteristics of a JFET. The JFET operates as a voltage-controlled device in which the voltage at the gate controls the amount of current through the device. A conventional JFET is normally in an on-state, e.g. a freely conducting state. The JFET is turned off by reverse-biasing the voltage between the gate and source. As such, a depletion region of high resistance expands through the conduction channel between the source and drain thereby reducing the cross-sectional area of the conduction channel and effectively shutting off the JFET. For an n-channel JFET as shown in Prior Art FIG. 1B, a negative voltage applied to the gate will pinch off the conduction channel. Conversely, in a p-channel transistor, a positive voltage applied to the gate will pinch off the conduction channel.

Therefore, it would be desirable to provide electrical circuits with cascade features of varying capabilities which are capable of operating under low voltage, low on-resistance, and high current density situations. In particular, it would be desirable to provide for signal amplification. It would also be desirable to provide for circuit switching capabilities for controlling motors, switching power supplies, and other applications.

These and other objects and advantages of the present invention will no doubt become obvious to those of ordinary skill in the art after having read the following detailed description of the preferred embodiment which is illustrated in the various drawing figures.

SUMMARY OF THE PRESENT INVENTION

In the present invention, a cascade circuit using normally-off junction field effect transistors (JFETs) is configured to amplify an input signal and capable of operating under low on-resistance, low voltages, and high current densities. The present invention also discloses a cascade circuit using normally-off JFETs configured to have switching characteristics and capable of operating under low on-resistance, low voltages and high current densities in a normally-off state.

Specifically, embodiments of the present invention comprise a three terminal gate-controlled cascade amplification circuit capable of signal amplification formed by two or more properly coupled normally-off junction field effect transistors supported on a substrate. In one embodiment, two normally-off JFETs are used for signal amplification where the source electrode from the first JFET is coupled to the gate electrode of the second JFET. Accordingly, three terminal control of the cascade amplification circuit is provided by the gate of the first JFET, coupling the drain electrodes from both JFETs, and lastly the source of the second JFET.

In another embodiment of the present invention, a four terminal gate-controlled cascade switching circuit is formed by properly coupling two normally-off JFETs supported on a substrate. The cascade switching circuit switches on to allow current to flow between the source and drain electrodes of the second JFET. The cascade switching circuit switches off to impede current flow between the source and drain electrodes of the second JFET. For four terminal operation, the source electrode from the first JFET is coupled to the gate electrode of the second JFET. Accordingly four terminal control of the cascade switching circuit is provided by the gate and drain electrodes of the first JFET, and the source and drain electrodes of the second JFET.

BRIEF DESCRIPTION OF THE DRAWINGS

The features of the invention believed to be novel and obvious over the prior art are set forth with particularity in the appended claims. The invention itself, both as to organization and method of operation, together with further objects and advantages thereof, may be best understood by reference to the following description considered in connection with the accompanying drawings, in which:

Prior Art

Prior Art

Prior Art

Prior Art

DETAILED DESCRIPTION OF THE PREFERRED EMBODIMENT

Reference will now be made in detail to the preferred embodiments of the present invention, electrical cascade circuits using normally-off junction field effect transistors, examples of which are illustrated in the accompanying drawings. While the present invention has been described in terms of the presently preferred embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

A normally-off junction field effect transistor supported on a substrate includes a gate surrounded by a depletion region. The depletion region responds to a forward bias applied at the gate to open a current conduction path through the substrate between the drain and the source. The current conduction path is pinched or cut-off when the gate is zero biased for the normally-off JFET. In contrast, for a normally-on JFET, the depletion region responds to a reverse bias applied to the gate to pinch off the current conduction path.

Figure 1A:
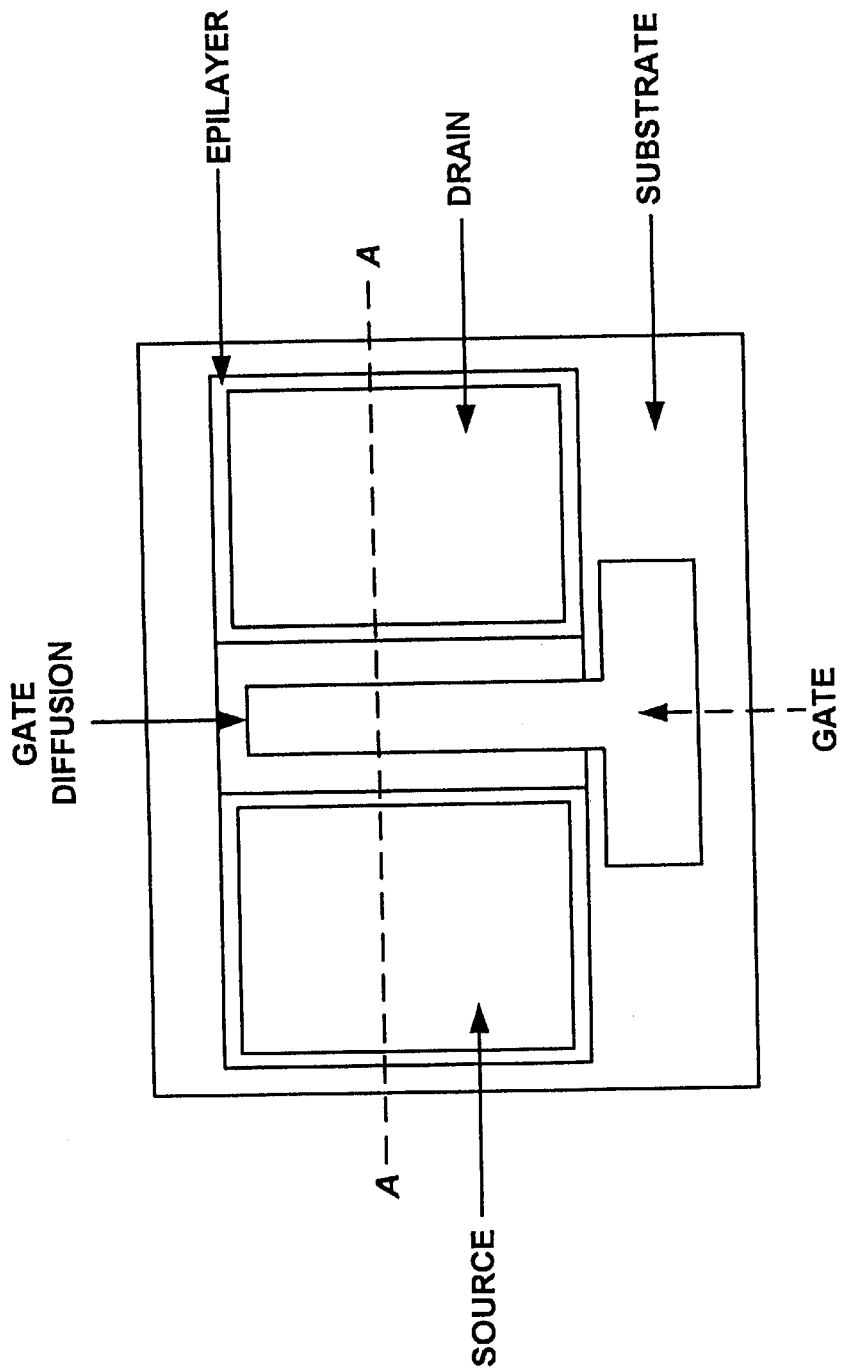
FIG. 1A is a top view of a conventional junction field effect transistor (JFET).
Figure 1B:
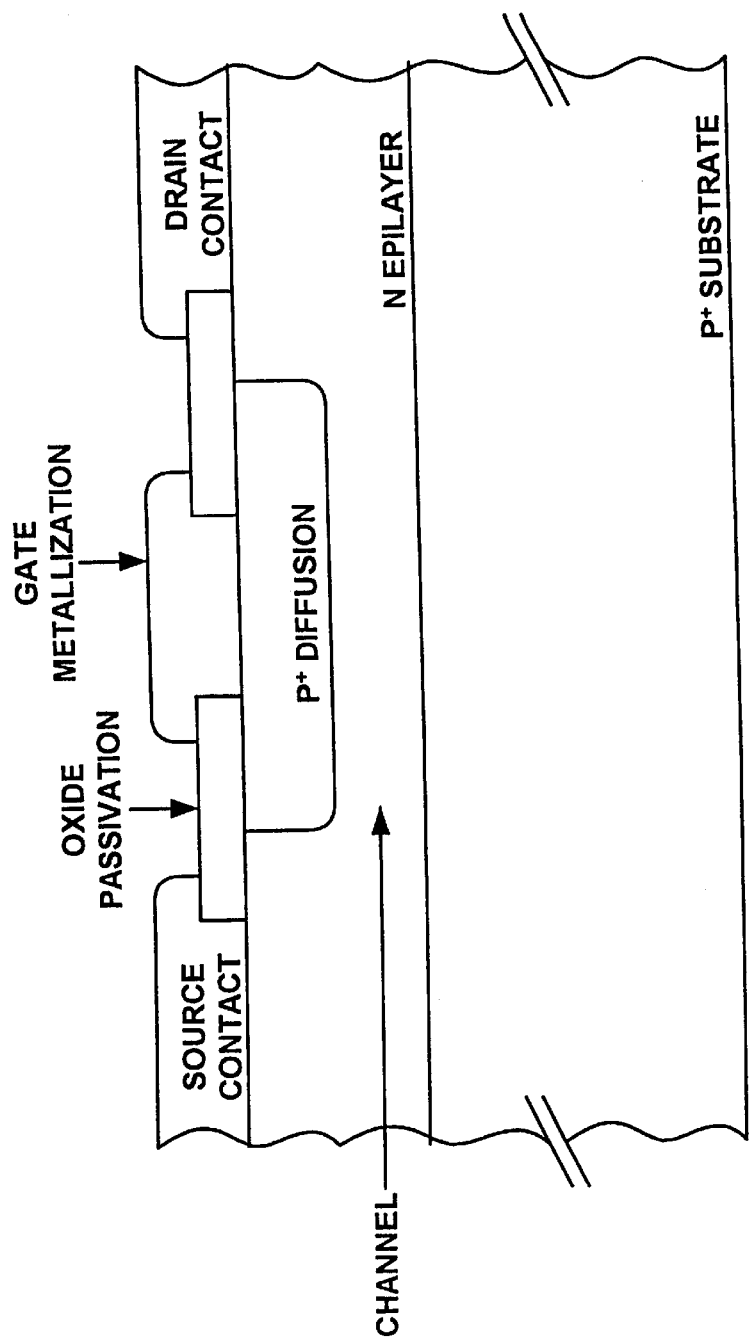
FIG. 1B illustrates a cross-sectional view of a conventional JFET.
Figure 1C:
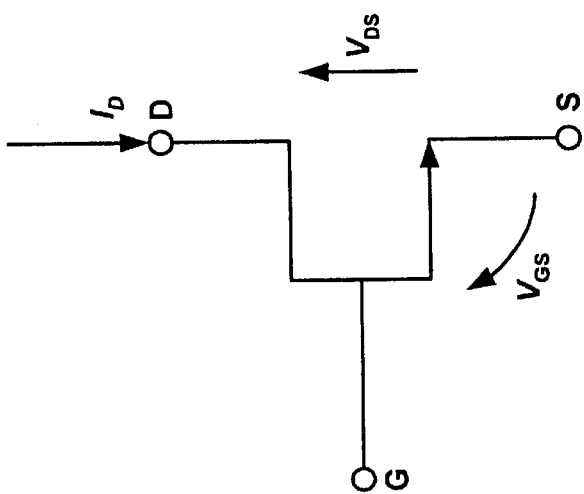
FIG. 1C illustrates an equivalent circuit of a conventional JFET.
Figure 1D:
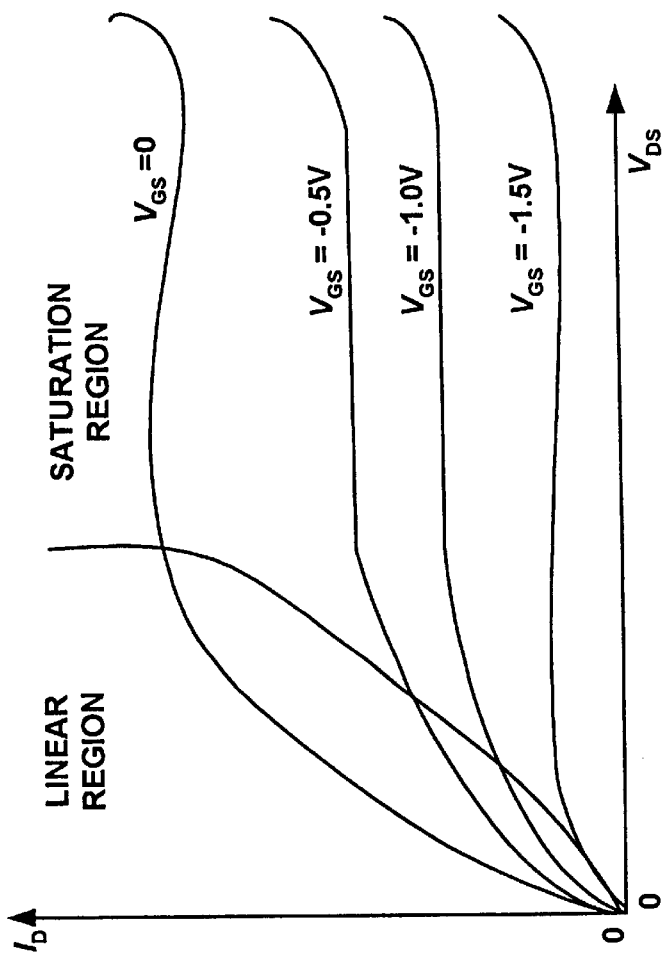
FIG. 1D illustrates a current voltage diagram of a conventional JFET.
Figure 2A:
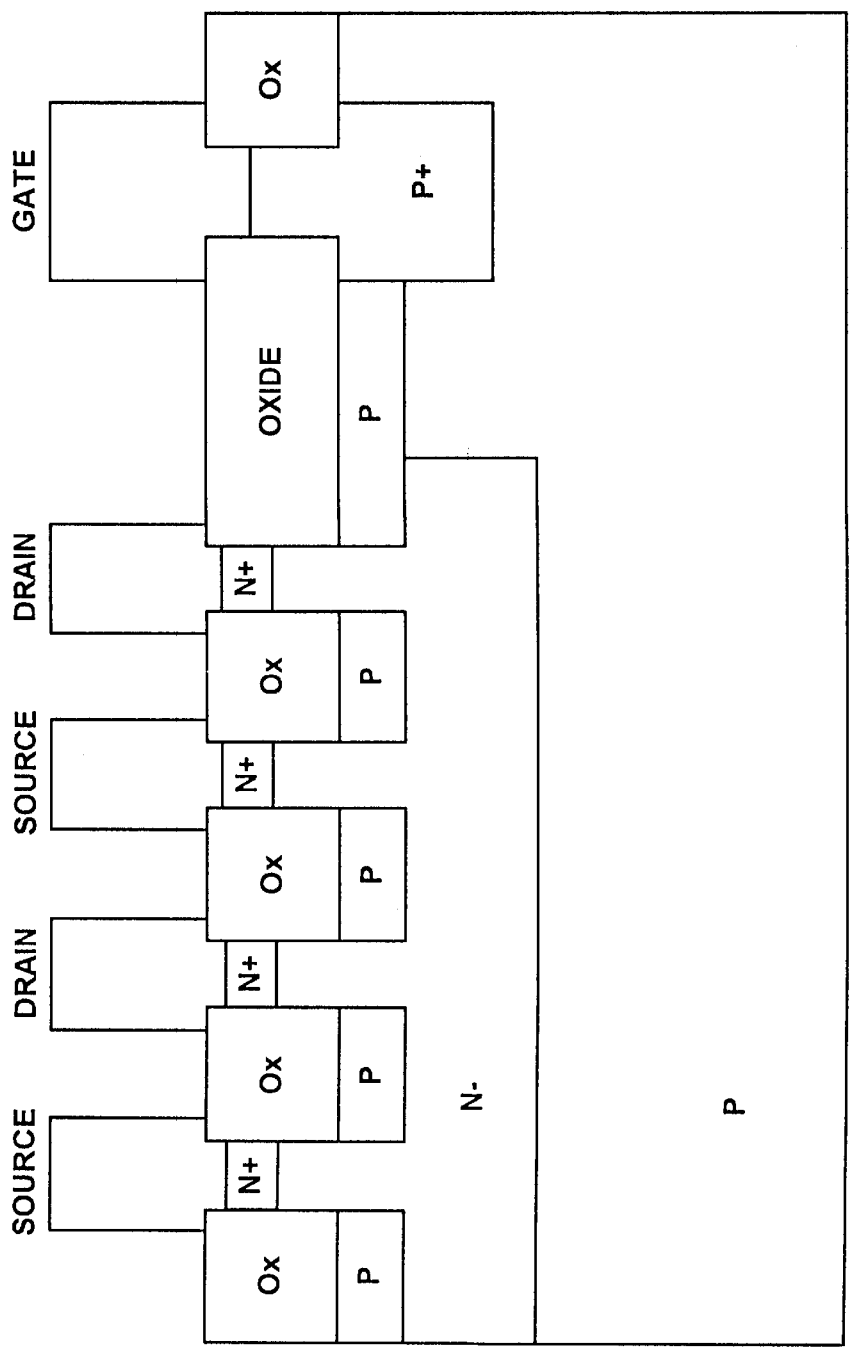
FIG. 2A illustrates a cross-sectional view of a normally-off n-channel JFET for low voltage applications which can be used in accordance with embodiments of the present invention.
Figure 2B:
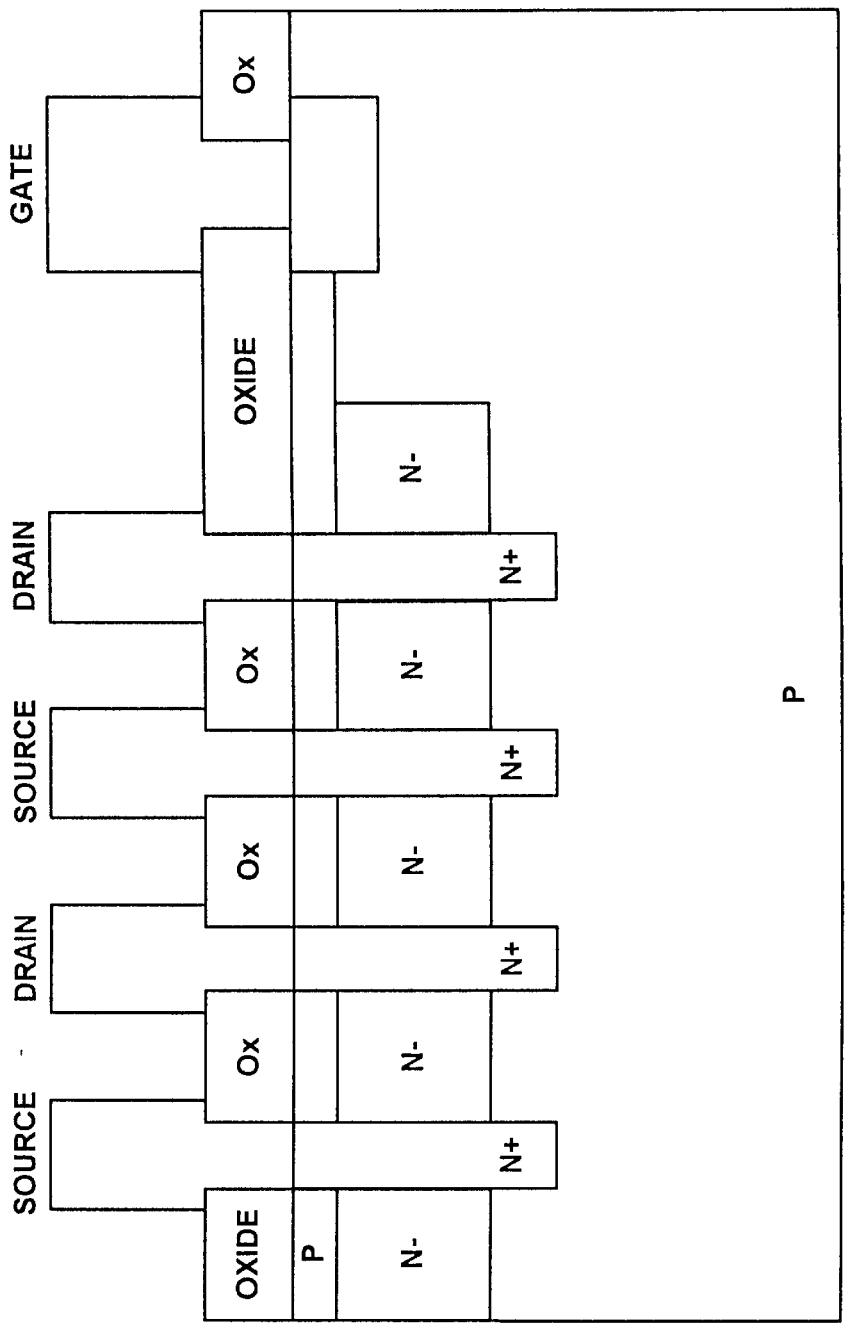
FIG. 2B illustrates a cross-sectional view of a normally-off n-channel JFET for low voltage applications which can be used in accordance with embodiments of the present invention.

Previous configurations of normally-on junction field effect transistors were limited to high voltage applications. The present inventor has developed both normally-on and normally-off JFETs that operate under low voltages, low voltage drop, high current density, and high frequency situations. These JFETs also exhibit low on-resistance characteristics. The JFET structure, operation, and general fabrication procedures are described in the following U.S. patent assigned to the present assignee: U.S. Pat. No. 6,251,716 issued on Jun. 26, 2001, entitled "NOVEL JFET STRUCTURE AND MANUFACTURE METHOD FOR LOW ON-RESISTANCE AND LOW VOLTAGE APPLICATION," by Ho-Yuan Yu (the present inventor), the disclosure of which is hereby incorporated herein by reference. FIGS. 2A and 2B show normally-off n-channel JFETs for low voltage applications which can be used in accordance with the embodiments of the present invention.

Figure 3:
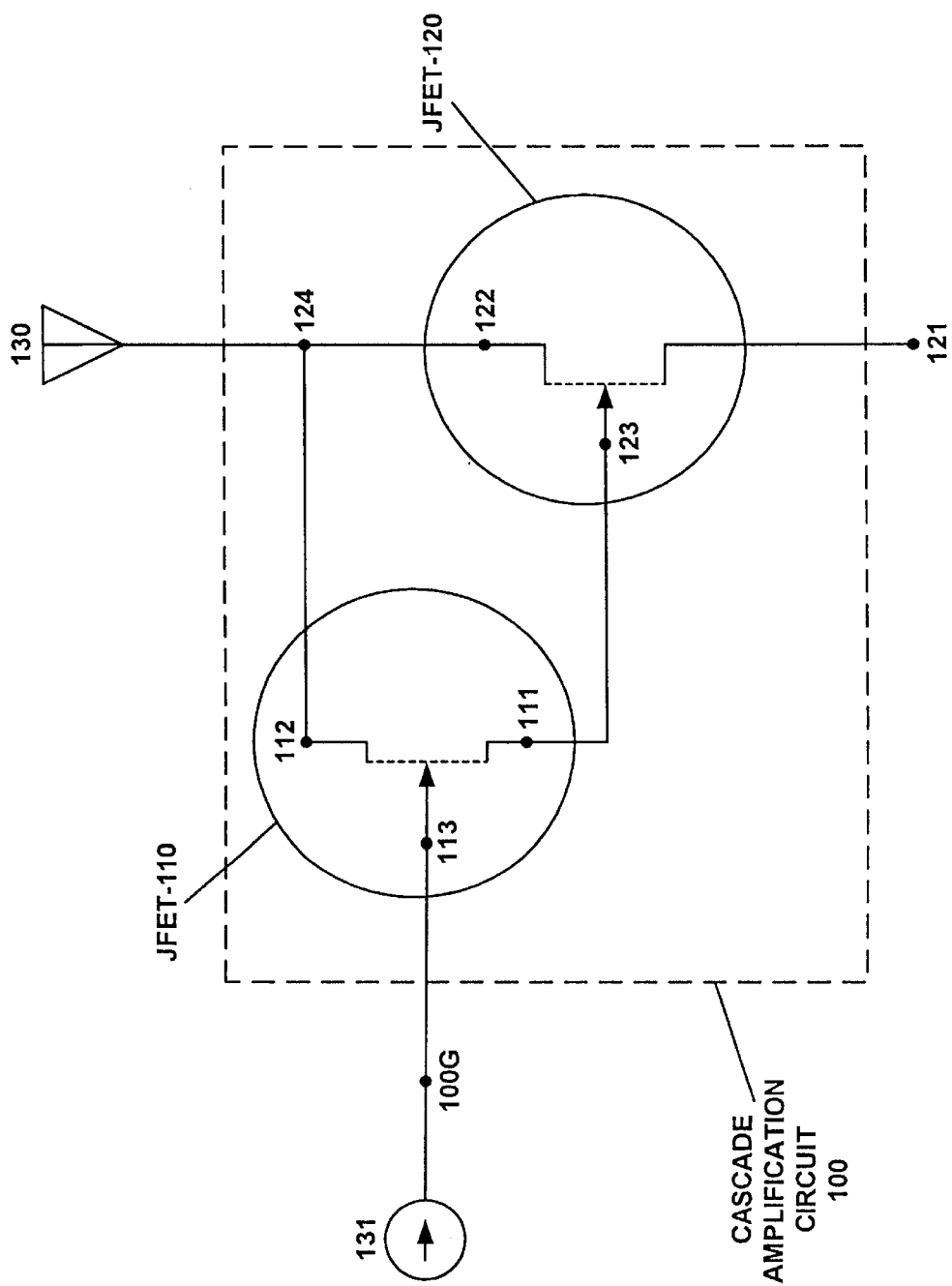
FIG. 3 schematically illustrates a three terminal gate-controlled cascade amplification circuit using normally-off n-channel JFETs, according to a preferred embodiment of the present invention.

Referring now to FIG. 3, an electrical schematic illustrating a three terminal gate-controlled cascade amplification circuit 100 using normally-off n-channel JFETs, according to a preferred embodiment of the present invention, will be described. In particular, the cascade amplification circuit 100 includes a JFET 110 having a source electrode 111, drain electrode 112, and gate electrode 113. Also, cascade amplification circuit 100 includes a JFET 120 having a source electrode 121, drain electrode 122, and gate electrode 123. The size and dimensions of JFET 110 can be about one percent of the size and dimension of JFET 120 depending on the signal gain and operational range required. JFETs 110 and 120 are preferably of the normally-off type capable of operating in the region of low voltage and high current densities. The source electrode 111 from JFET 110 is electrically coupled to the gate electrode 123 from JFET 120. The drain electrodes 112 and 122 are electrically coupled to a common drain node 124. A constant voltage source 130 is coupled to common node 124. The gate electrode 113 is coupled to a circuit control gate terminal 100G.

As will be understood by those skilled in the art, in general, when using normally-off JFETs for amplification, amplification of the input signal occurs at each JFET. In the present embodiment, amplification of cascade amplification circuit 100 occurs when gate electrode 113 is forward biased. With proper bias, the depletion region in JFET 110 responds to open a current path in the substrate resulting in signal amplification of the input signal 131 located at circuit control gate terminal 100G. This amplified signal at source electrode 111 then forward biases gate 123 resulting in further amplification of the input signal 131 through JFET 120. Total signal amplification through the amplification circuit 100 is realized at source electrode 121. Proper configuration of the cascade amplification circuit 100, will give signal gain between 80 dB to 120 dB depending on the amplification characteristics of the JFETs 110 and 120.

Further, each of the aforementioned normally-off JFETs 110 or 120 may comprise individual or discrete circuit elements, or may be formed in integrated circuit form. Moreover, the cascade amplification circuit 100 can also use normally-off p-channel JFETs.

In addition to the above-mentioned characteristics, further signal gain can be achieved through multiple stages of amplification by properly coupling additional JFETs. Therefore, in another embodiment, the cascade amplification circuit 100 can have increased signal amplification by cascading three or more properly coupled normally-off JFETs in a semiconductor substrate which collectively form a three terminal gate-controlled cascade amplification circuit.

In another embodiment of the present invention, two properly coupled JFETs in a semiconductor substrate collectively form a four terminal gate-controlled cascade switching circuit suitable for low voltage and high current density operations. For four terminal operation, the source electrode from the first JFET is coupled to the gate electrode of the second JFET. Accordingly four terminal control of the cascade switching circuit is provided by the gate and drain electrodes of the first JFET, and the source and drain electrodes of the second JFET.

Initially, the cascade switching circuit is turned-off. No current flows between the source and drain of the second JFET of the cascade switching circuit because of the use of normally-off JFETs. Application of a turn-on forward bias signal at the gate electrode of the first JFET allows for majority carrier conduction from the source electrode to the drain electrode of the first JFET. Correspondingly, the gate of the second JFET becomes forward biased and allows for majority carrier conduction from the source electrode to the drain electrode of the second JFET thereby turning the cascade switching circuit on. Accordingly, a forward bias at the gate of the first JFET turns on the cascade switching circuit and creates a current conduction path between the drain and source electrodes of the second JFET. Conversely, a zero bias at the gate of the first JFET turns off the cascade switching circuit.

Figure 4:
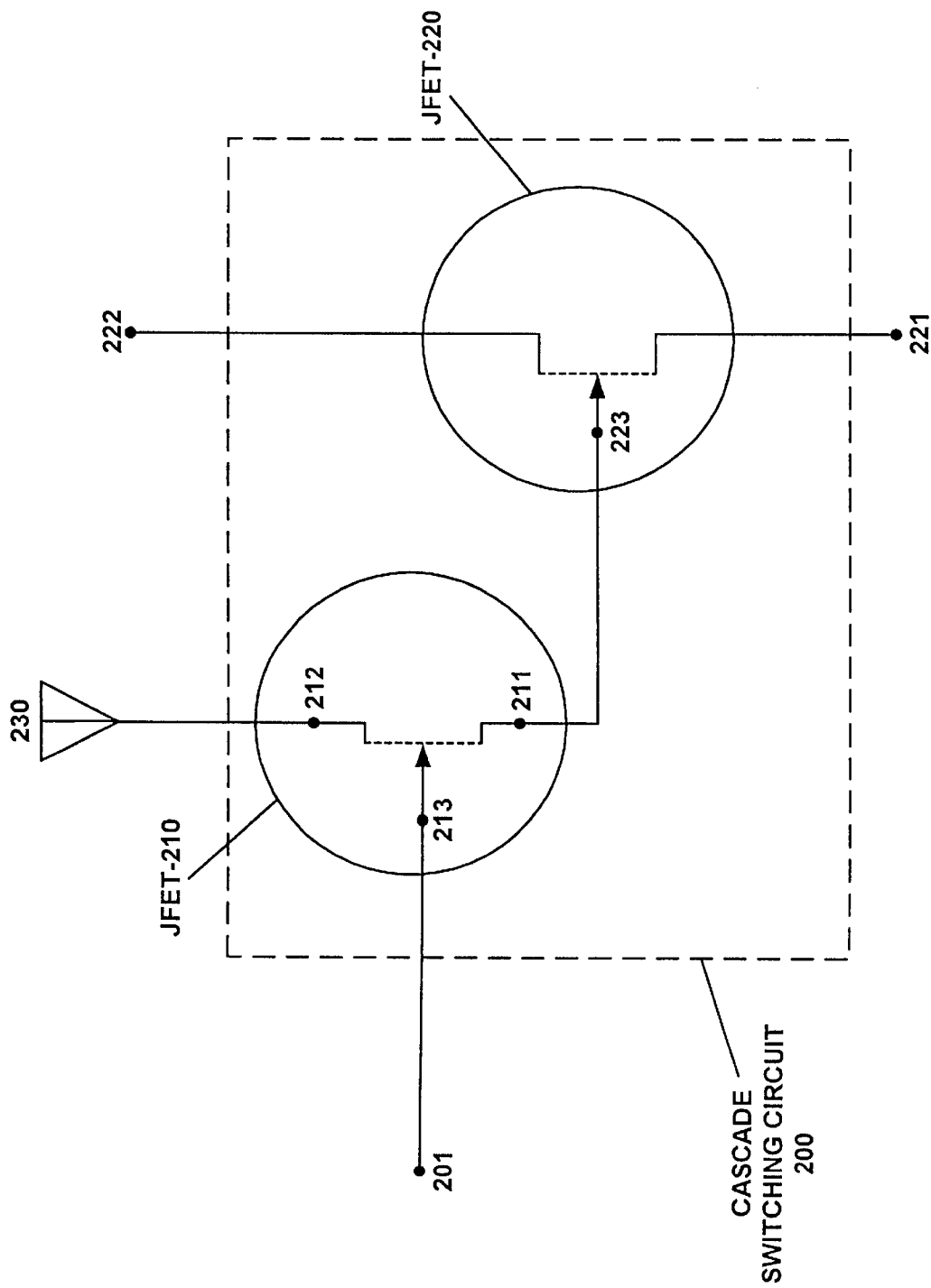
FIG. 4 schematically illustrates a four terminal gate-controlled cascade switching circuit using normally-off n-channel JFETs, according to a preferred embodiment of the present invention.

Referring now to FIG. 4, an electrical schematic illustrating a four terminal gate controlled cascade switching circuit 200 using normally-off n-channel JFETs, according to the present embodiment of the present invention, will be described. In particular, the cascade switching circuit 200 includes a JFET 210 having a source electrode 211, drain electrode 212, and gate electrode 213. Also, switching circuit 200 includes a JFET 220 having a source electrode 221, drain electrode 222, and gate electrode 223. In its normal configuration, the source electrode 211 is electrically coupled to the gate electrode 223 and the drain electrode 212 is coupled to a constant voltage source 230. The gate electrode 213 is coupled to a circuit control gate terminal 201. JFETs 210 and 220 are preferably of the normally-off type capable of operating in the region of low voltage and high current densities.

As will be understood by those skilled in the art, the cascade switching circuit 200 will normally be turned off. For example, if the gate electrode 213 from JFET 210 is held at zero potential bias, the switching circuit 200 will block current flow through JFET 220 even when the drain electrode 222 is positively biased with respect to the source electrode 221.

To turn on the switching circuit, a forward gate bias is applied to gate electrode 213 from circuit control gate terminal 201 to open a current path between the drain electrode 212 and source electrode 211. Since source electrode 211 is coupled to gate electrode 223, a forward gate bias is also applied to gate electrode 223. This allows for current to flow through JFET 220 between the drain electrode 222 and source electrode 221.

Further, each of the aforementioned normally-off JFETs 210 or 220 may comprise individual or discrete circuit elements, or may be formed in integrated circuit form. Likewise, normally-off p-channel JFETs can also be used in the four terminal gate controlled cascade switching circuit 200.

I claim:

1. A three terminal gate-controlled cascade amplification circuit using normally-off junction field effect transistors, comprising:
   a first normally-off junction field effect transistor having a first source electrode, first drain electrode and first gate electrode;
   a second normally-off junction field effect transistor having a second source electrode, second drain electrode and second gate electrode, wherein the first and second normally-off junction field effect transistors open a very low resistance current path between respective source and drain electrodes when forward biased, the first and second normally-off junction field effect transistors for use in low voltage, less than 3 volts, high current capacity, greater than 100 Amperes, applications, the first normally-off junction field effect transistor being directly coupled to the second normally-off junction field effect transistor by a coupling means; and
   the first gate electrode constituting a circuit control gate terminal.

2. A three terminal gate-controlled cascade amplification circuit using normally-off junction field effect transistors as in claim 1, wherein the means for coupling comprises:
   the second gate electrode electrically coupled to the first source electrode; and
   a common drain node, wherein the first drain electrode is coupled to the second drain electrode at the common drain node.

3. A three terminal gate-controlled cascade amplification circuit using normally-off junction field effect transistors as in claim 1, wherein a signal input at the circuit control gate terminal is amplified at the second normally-off junction field effect transistor.

4. A three terminal gate-controlled cascade amplification circuit using normally-off junction field effect transistors as in claim 2, wherein the common drain node is coupled to a constant voltage source.

5. A three terminal gate-controlled cascade amplification circuit using normally-off junction field effect transistors as in claim 1, further comprising:
   means for coupling three or more normally-off junction field effect transistors, to include the first and second normally-off field effect transistors, in cascade form to further increase signal amplification.

6. A three terminal gate-controlled cascade amplification circuit using normally-off junction field effect transistors as in claim 4, further comprising:
   means for coupling three or more normally-off junction field effect transistors, to include the first and second normally-off field effect transistors, in cascade form to further increase signal amplification.

7. A three terminal gate-controlled cascade amplification circuit using normally-off junction field effect transistors as in claim 1, wherein the cascade amplification circuit is formed on a semiconductor substrate.

8. A three terminal gate-controlled cascade amplification circuit using normally-off junction field effect transistors as in claim 4, wherein a signal input at the circuit control gate terminal is amplified at the second source electrode.

9. A three terminal gate-controlled cascade amplification circuit as recited in claim 1, wherein said first and second transistors are normally-off n-channel junction field effect transistors.

10. A three terminal gate-controlled cascade amplification circuit as recited in claim 1, wherein said first and second transistors are normally-off p-channel junction field effect transistors.

11. A four terminal gate-controlled cascade switching circuit using normally-off junction field effect transistors, comprising:
   a first normally-off junction field effect transistor having a first source electrode, first drain electrode and first gate electrode;
   a second normally-off junction field effect transistor having a second source electrode, second drain electrode, and second gate electrode, wherein the first and second normally-off junction field effect transistors open a very low resistance current path between respective source and drain electrodes when forward biased, the first and second normally-off junction field effect transistors for use in low voltage, less than 3 volts, and high current capacity, greater than 100 Amperes, applications;
   the first normally-off junction field effect transistor coupled to the second normally-off junction field effect transistor by a coupling means for controlling current flow through the second normally-off junction field effect transistor; and
   the first gate electrode constituting a circuit gate terminal.

12. A four terminal gate-controlled cascade switching circuit using normally-off junction field effect transistors as in claim 11, wherein the means comprises:
   the second gate electrode electrically coupled to the first source electrode; and
   wherein the first drain electrode is coupled to a constant voltage source.

13. A four terminal gate-controlled cascade switching circuit using normally-off junction field effect transistors as in claim 11, wherein the cascade switching circuit is formed on a semiconductor substrate.

14. A four terminal gate-controlled cascade switching circuit using normally-off junction field effect transistors as in claim 12, wherein the cascade switching circuit is formed on a semiconductor substrate.

15. A four terminal gate-controlled cascade switching circuit using normally-off junction field effect transistors as in claim 11, wherein the circuit gate terminal controls current flow through the second normally-off junction field effect transistor.

16. A four terminal gate-controlled cascade switching circuit using normally-off junction field effect transistors as in claim 12, wherein the circuit gate terminal controls current flow between the second drain electrode and second source electrode.

17. A four terminal gate-controlled cascade switching circuit as recited in claim 11, wherein said first and second transistors are normally-off n-channel junction field effect transistors.

18. A four terminal gate-controlled cascade switching circuit as recited in claim 11, wherein said first and second transistors are normally-off p-channel junction field effect transistors.

* * * * *